(12) United States Patent
Fujiwara et al.

(10) Patent No.: US 12,354,694 B2
(45) Date of Patent: Jul. 8, 2025

(54) APPARATUSES AND METHODS FOR DYNAMIC COLUMN SELECT SWAPPING

(71) Applicant: MICRON TECHNOLOGY, INC., Boise, ID (US)

(72) Inventors: Yoshinori Fujiwara, Boise, ID (US); Kristopher Kopel, Boise, ID (US); Kosei Kudo, Kanagawa (JP)

(73) Assignee: Micron echnology, Inc., Boise, ID (US)

( * ) Notice: Subject to any disclaimer, the term of this patent is extended or adjusted under 35 U.S.C. 154(b) by 577 days.

(21) Appl. No.: 17/654,275

(22) Filed: Mar. 10, 2022

(65) Prior Publication Data

US 2023/0290428 A1 Sep. 14, 2023

(51) Int. Cl.
*G11C 29/00* (2006.01)
*G11C 11/408* (2006.01)
*G11C 11/4094* (2006.01)
*G11C 11/4097* (2006.01)
*H03K 19/20* (2006.01)

(52) U.S. Cl.
CPC .......... *G11C 29/76* (2013.01); *G11C 11/4087* (2013.01); *G11C 11/4094* (2013.01); *G11C 11/4097* (2013.01); *H03K 19/20* (2013.01)

(58) Field of Classification Search
CPC . G11C 29/76; G11C 11/4087; G11C 11/4094; G11C 11/4097; G11C 2029/1202; G11C 2029/1204; G11C 29/846; G11C 29/808; G11C 11/40611; G11C 11/4063; G11C 11/4076; H03K 19/20

See application file for complete search history.

(56) References Cited

U.S. PATENT DOCUMENTS

| 5,953,269 A | * | 9/1999 | Manning | G11C 29/808 365/201 |
| 11,450,404 B1 | * | 9/2022 | Kim | G11C 29/787 |
| 2021/0166776 A1 | * | 6/2021 | Wieduwilt | G11C 29/789 |

* cited by examiner

*Primary Examiner* — Donald H B Braswell
(74) *Attorney, Agent, or Firm* — Dorsey & Whitney LLP

(57) ABSTRACT

Embodiments of the disclosure are drawn to apparatuses and methods for dynamic column select swapping. A memory may have a number of sets of bit lines organized into column planes. If a set of bit lines associated with a first address in a first column plane is defective, it may be repaired by reassigning the first address to a redundant set of bit lines in a global column redundant (GCR) column plane. If a set of bit lines associated with the first address in a second column plane is also defective, then swap logic of the memory may swap the first address to a second address and assign it to the set of bitlines in the second column plane. The second address may then also be repaired by being reassigned to the GCR column plane.

17 Claims, 6 Drawing Sheets

APPARATUSES AND METHODS FOR DYNAMIC COLUMN SELECT SWAPPING

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations. A row or column containing a failed memory cell (which may be referred to as a defective row/column, a bad row/column, or a faulty row/column) may be identified. The memory device may contain additional rows/columns of memory which may be used in repair operations (e.g., redundant rows/columns). During a repair operation, an address associated with the defective row/column may be redirected, such that the address points to a redundant row/column instead.

DETAILED DESCRIPTION

Figure 1:
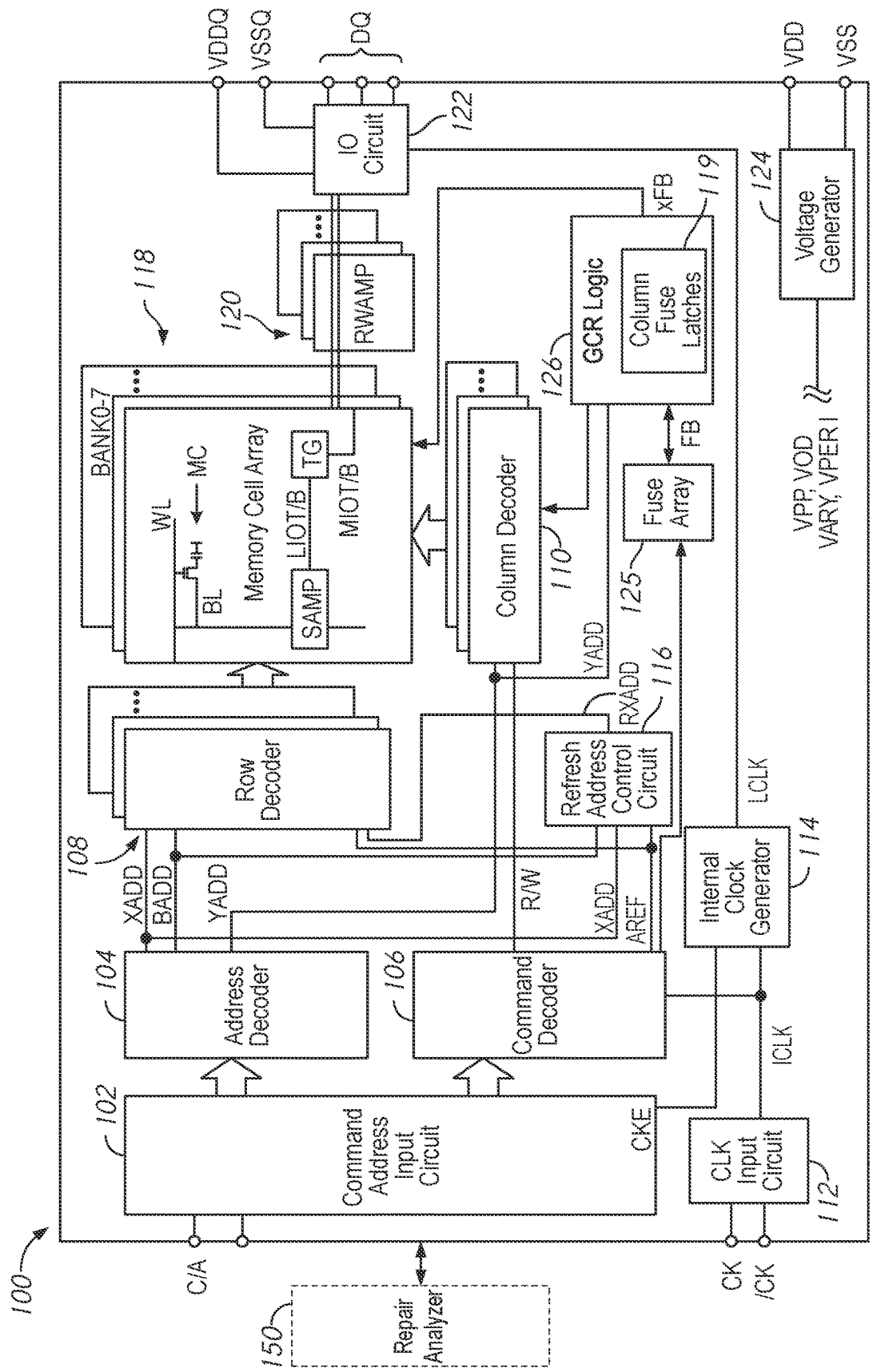
FIG. 1 is a block diagram of a semiconductor device according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

The columns may generally be organized into column planes, each of which includes a number of sets of individual columns all activated by a column select signal. For example, a column plane may include some number N of column select (CS) signals, each of which may activate some number M of individual bit lines. As used herein, a column select set or CS set may generally refer to a set of bit lines which are activated by a given value of the CS signal within a column plane. The column select signal may be represented by (all or a portion of) a column address CA.

Certain memory cells may be defective, and columns containing the defective memory cells may generally be referred to as defective columns (or bad columns or faulty columns). The memory may include an additional column plane, which includes a number of redundant CS sets which may be used for repair operation, such as global column redundancy (GCR) operations. The additional column plane may be referred to as a GCR column plane (or GCR-CP). As part of GCR operation, a defective CS set within a column plane may be identified. Information, such as a column address, may be programmed into a fuse array which remaps that column address (e.g., that value of CS) from the column plane to the value of CS in the GCR-CP. Subsequently, when the address previously associated with the defective CS set in the first column plane is accessed, the redundant set of bit lines in the GCR-CP are accessed instead. However, problems may arise where multiple column plans have the same value of CS as a defective CS. Since the GCR-CP has only one CS set for each value of CS then the same value of CS can't be remapped from two different column planes to the GCR-CP as there would be a 'collision' between those addresses in the GCR-CP.

The present disclosure is generally directed to dynamic column select swapping. If the same value of CS is determined to be defective in two different column planes, then an address associated with the CS value in one of the column planes may be programmed into a fuse array along with a swap enable signal. The memory may swap which bit lines the CS value maps to in the column plane. For example, if a CS value A is defective in both a first and second column plane, then in the second column plane, the CS value A may be remapped so that it is associated with non-defective bit lines, while a CS value B may be associated with the defective bit lines in the second column planes. In other words, the logical addresses A and B may be swapped so that they are associated with the physical addresses that the other logical address would normally be associated with. The address A from the first column plane and the address B from the second column plane may then both be repaired to the GCR-CP. In this manner, bit lines which (originally) share a CS value in different column planes may both be repaired. In some example embodiments, the CS value may be remapped by swapping a logical level of one or more bits (such as a most significant bit) of the column address associated with that CS value.

FIG. 1 is a block diagram of a semiconductor device according to at least some embodiment of the disclosure.

The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements (fuses or anti-fuses) which may store information about addresses in the memory array 118. Each fuse may start in a first state (e.g., an anti-fuse may be insulating), and may be 'blown' to permanently change the fuse's state (e.g., a blown anti-fuse may be conductive). For ease of reference, the term 'fuse' may be used to refer to any non-volatile storage element. Each fuse may be considered to be a bit, which is in one state before it is blown, and permanently in a second state after it's blown. For example, a fuse may represent a logical low before it is blown and a logical high after it is blown.

Groups of fuses may store a binary signal which may be used to control and/or alter operations of the memory. For example, the fuse array 125 includes repair information which may be used to perform repair operations. For example, the fuse array may include sets of information related to GCR operations. Each set may specify bit line (or set of bit lines) to be repaired, for example by programming in a column plane address and column address. As described in more detail herein, each set may also specify if the address should be swapped.

The address information in the fuse array 125 may be 'scanned' out along a fuse bus (FB) to column latches 119 (or redundant column latches) of the GCR logic circuit 126. Each column latch 119 may be associated with a particular bit line or set of bit lines in the memory array 118. Each redundant column latch 119 may store an address previously associated with a set of normal bit lines which have failed, to reassign that address to a redundant set of bit lines. For example, each column latch 119 may store a CS address identified as being associated with a defective CS set of bit lines and reassign that CS address to a redundant CS set of bit lines. The information and addresses may be scanned out from the fuse array 125 along the fuse bus, and may be latched by a particular column latch 119.

A GCR logic circuit 126 may be positioned along the fuse bus, and may use the information stored in the fuse array 125 to determine which column addresses have been repaired (e.g., if they should be stored in column latch 119 associated with a redundant set of bit lines) and to determine if the addresses should be swapped. If the swap signal is active in a given set of information, then the address in that set may be swapped with another addresses in the same column plane, such that the logical addresses of two sets of bit lines are swapped with each other. In other words, if the address A is normally associated with physical bit lines A' and the address B is normally associated with physical bit lines B', then if the swap signal for address A is active, the address B would be stored in the column latch associated with A' and the address A would be stored in the column latch associated with B'.

An optional repair analyzer 150 may be used to program the fuse array. In some embodiments, the repair analyzer 150 may be an external device, such as a tester. The repair analyzer may test the memory array to locate defective addresses. For example, test data may be written to each bit line and then read out to determine if the read data matches the written data. Based on the determined failed bit lines, the repair analyzer may program the fuse array 125. For example, the fuse array may be programmed with the address of a failed set of bit lines to repair that address by assigning it a redundant set of bit lines in a GCR-CP. If the repair analyzer 150 detects a 'collision', the same address being defective in two different column planes, then it may program the first address for the first column plane as is, and then alter the second address before programming it in along with an active swap signal. For example, an address A may be programmed into the fuse array along with a first column plane address while an address B may be programmed into the fuse array along with a second column plane address and an active swap signal. The value of the address B may be determined by the manner in which addresses are swapped. In some embodiments, one or more bits may have their logical levels changed to swap the addresses. For example, in some embodiments, the active swap signal may cause the most significant bit of the address to be inverted, and accordingly the address B may be the result of inverting the most significant bit of the address A. Other bits, or other numbers of bits may be swapped in other embodiments.

The semiconductor device 100 may employ a plurality of external terminals that include command and address (C/A) terminals coupled to a command and address bus to receive commands and addresses, clock terminals to receive clocks CK and/CK, data terminals DQ to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110 and to the GCR logic circuit 126. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder 108 may access the wordline associated with the row address XADD (unless the row address has been repaired, in which case redundant word lines may be accessed instead). The read command is received by the command decoder 106, which provides internal commands so that read data from the memory array 118 is provided to the read/write amplifiers 120. The column decoder 110 may activate a CS signal to access the bit line(s) associated with YADD, unless YADD is loaded in the column redundancy latch 119, in which case the redundant bit line(s) associated with that latch are accessed instead. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The column decoder 110 may activate a column select CS signal to access bit lines corresponding to YADD. If the column address YADD matches with an address stored in the redundant column latches 119, then redundant columns may be activated instead. The write data is supplied via the input/output circuit 122 to the read/write amplifiers 120, and by the read/write amplifiers 120 to the memory array 118 to be written into the memory cell MC.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic. In some embodiments, the refresh address control circuit 116 may perform both auto-refresh operations, where the wordlines of the memory array 118 are refreshed in a sequence, and targeted refresh operations, where specific wordlines of the memory are targeted for a refresh out of sequence from the auto-refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
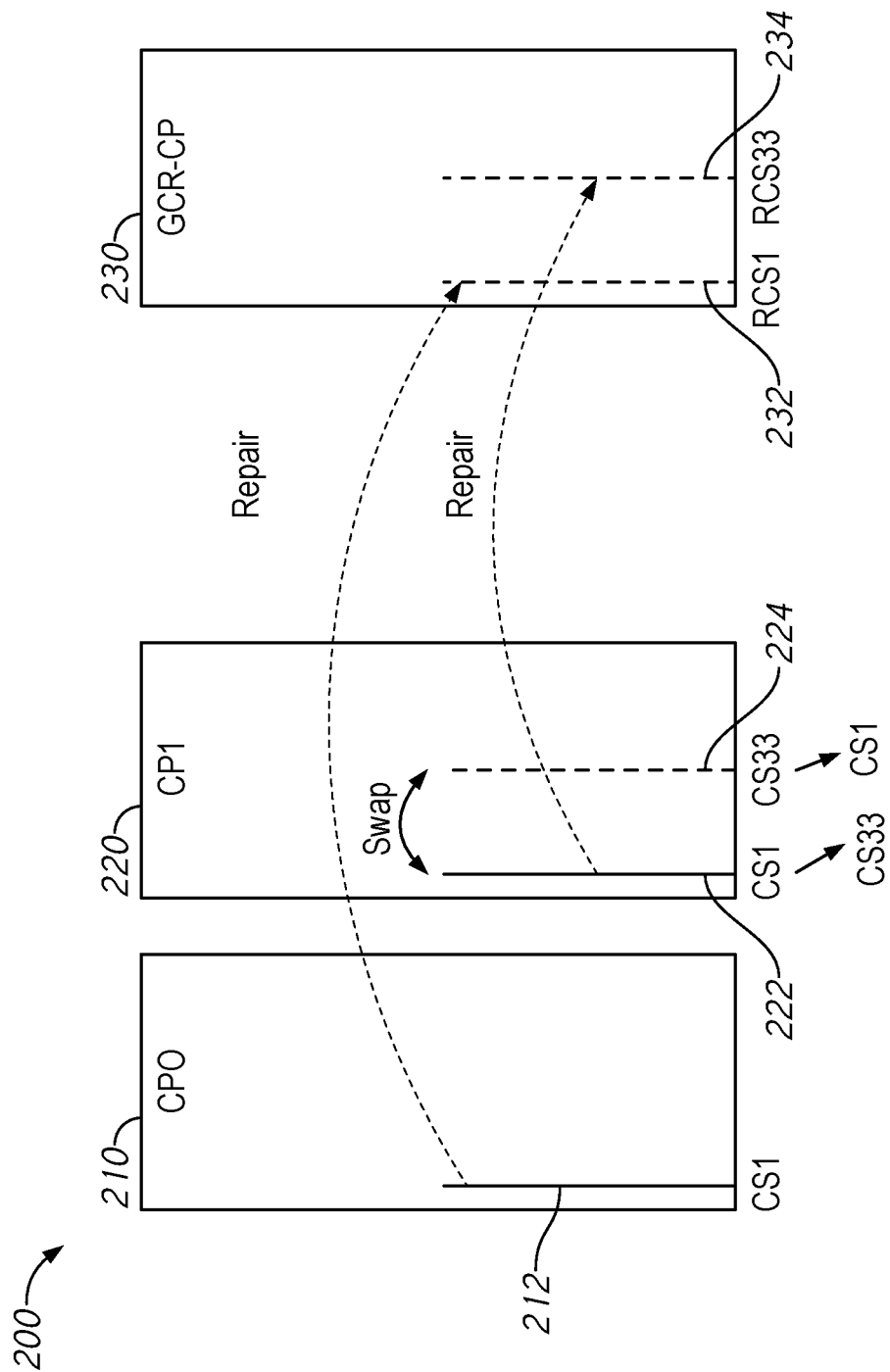
FIG. 2 is a block diagram of column select remapping according to some embodiments of the present disclosure.

FIG. 2 is a block diagram of column select remapping according to some embodiments of the present disclosure. FIG. 2 shows a portion of a memory array 200, including two column planes 210 and 220 and a GCR-CP 230. Each column plane includes a number of bit lines which are grouped into sets activated by a common column select (CS) signal. For the sake of illustration, a single line is used to represent the set of bit lines which share a CS value in common even though several individual bit lines share the same CS value. The CS value may be a portion of a column address used to access the column. For example, certain bits of a column address CA may be used to specify the CS value The first column plane (CP0) 210 includes a defective CS set 212. The CS set 212 includes one or more bit lines which are defective. The CS set 212 is activated by a value '1' of the CS signal (e.g., CS1). The CS set 212 may be repaired as part of a GCR operation by remapping the address CS1 in CP0 so that a CS set 232 is activated in the GCR-CP 230 when an address is received that indicates CS1 and CP0. This is indicated by RCS1 (repaired CS1) in column plane 230.

The second column plane (CP1) also includes a CS set 222 which is defective. In CP1 220, the defective CS set 222 is also CS1. This presents a problem as there is a 'collision' between the value of CS which is defective in two column planes 210 and 220. To resolve, this, the column select value '1' is swapped with a different, non-defective, CS set. For example, the CS set 224, which has an address of CS33. The addresses CS1 and CS33 are swapped, such that CS33 now accesses CS set 222 and address CS1 now accesses CS set 224 in column plane 220. The defective CS set 222 may now be repaired, because it has a different column select address (e.g., CS33) than the column select address (e.g., CS1) of the defective CS set in the first column plane 210. Accordingly, the address CS33 in CP1 220 may be repaired, by remapping it to a CS set 234 in GCR-CP 230 associated with the repaired CS address RCS33.

In this manner, two defective CS sets 212 and 222, each of which (initially) has the same CS address (e.g., CS1) may both be repaired. After swapping the CS addresses, the two defective CS sets are associated with different CS addresses (e.g., CS1 and CS33), while in the second column plane CP1, the address CS1 is associated with a non-defective CS set 224.

While for sake of explanation the example of FIG. 2 involves two sequentially numbered column planes, it is not necessary for the two column planes to have sequential values or any other relationship with each other. Similarly, while example addresses CS1 and CS33 are used, these values are for example only.

Figure 3:
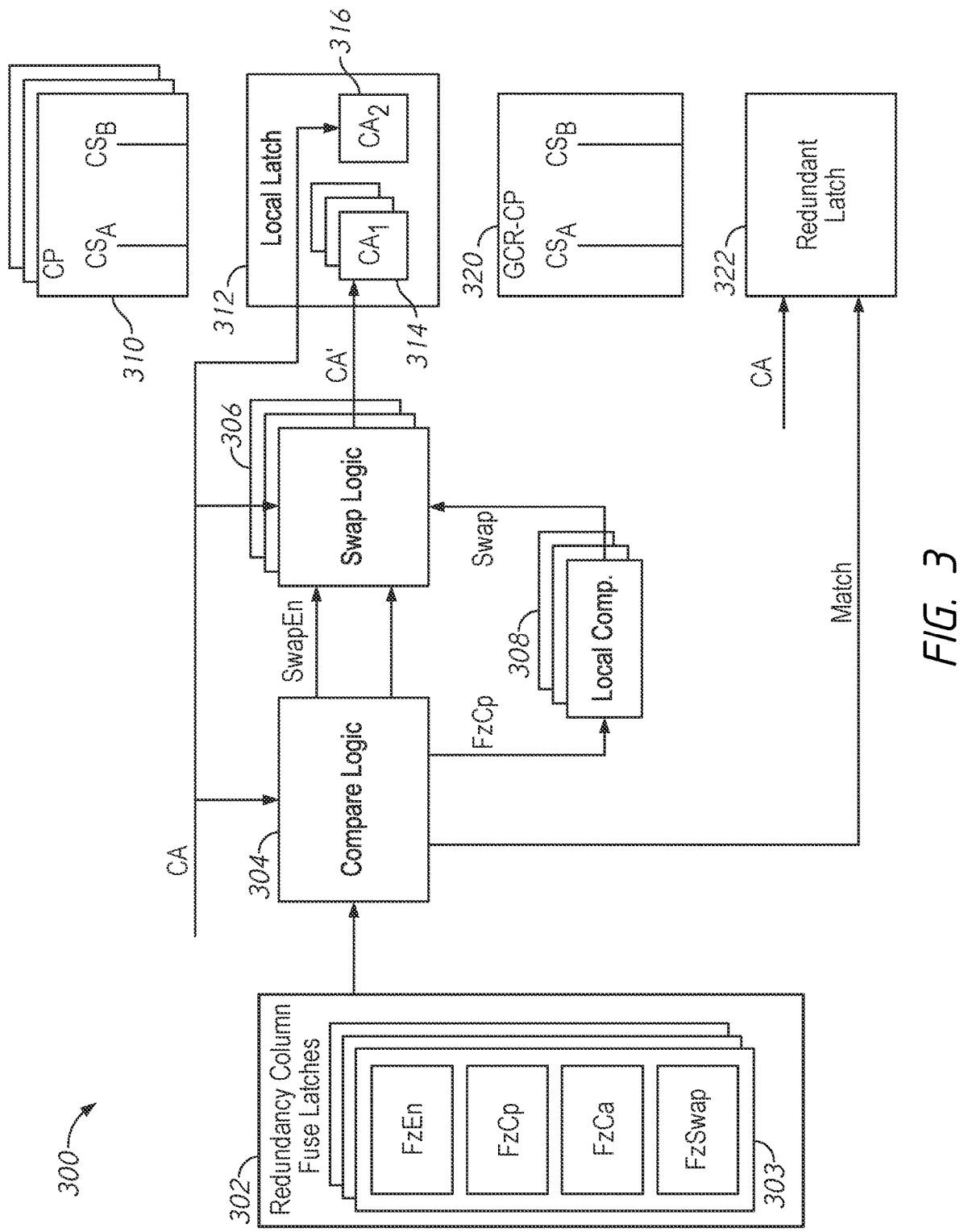
FIG. 3 is a block diagram of GCR logic according to some embodiments of the present disclosure.

FIG. 3 is a block diagram of GCR logic according to some embodiments of the present disclosure. The GCR logic 300 may, in some embodiments, be included in the memory device 100 of FIG. 1 and/or may be used to implement the GCR operations discussed with respect to FIG. 2. The GCR logic 300 includes several components of a memory device (e.g., 100 of FIG. 1) which are relevant to the GCR operations and swapping addresses of selected CS sets within a column plane.

The GCR logic 300 includes a set of column planes CP 310, and a GCR-CP 320. The CPs 310 and GCR-CP 320 are portions of a memory array (e.g., 118 of FIG. 1), and include a number of memory cells arranged at the intersection of word lines (rows) and bit lines (columns). The bit lines within a given CP (or GCR-CP) are organized into sets, activated by a common value of a column select signal CS (e.g., all or part of a column address). For clarity, only a single line is shown to represent the set of bit lines.

The column planes are associated with latches/decoders 312. The latches/decoders 312 may provide decoded address signals based on the column address (or a portion thereof). These decoded address signals may activate the CS signals within the column plane 310. The latches/decoders 312 may include a factor latch 312 which is shared among the column planes and local latches 314 which are specific to each column plane 310. The factor latch 316 may provide a first decoded signal in common to column planes, and the local latches 314 provide a second decoded signal to the associated column plane. Based on the first and the second decoded signal, a column select signal is activated. The factor latches 314 and local latches 316 may receive different portions of the column address CA and may generate decoded signals based on their respective portions.

There may be a number of CPs 310 and their affiliated local latches 314. For example, there may be 33 CPs (32 for data and 1 for error correction information) and 33 local latches 314, along with an additional GCR-CP and its local latch 322. More or fewer CPs may be used in other examples. The stacked boxes used to represent the CPs 310 and local latches 314 are used to represent components which are repeated for each CP 310 (e.g., repeated 33 times). Similarly, stacked boxes are used to represent other components which are repeated for each of the CPs 310.

The GCR logic 300 includes redundancy column fuse latches 302 (e.g., 119 of FIG. 1) which stores various pieces of information, encoded by the states of fuses within a fuse array (e.g., 125 of FIG. 1). In FIG. 3, the fuse latches 302 are shown including a set of signals 303, including signals FzEn, FzCp, FzCa, and FzSwap. This set of signals 303 may be repeated multiple times. The signal FzEn is a fuse enable signal and indicates if the fuse array includes information for this column plane. If FzEn is not active (e.g., at a low logic level) then it may indicate that no repairs or swaps have been made in this column plane 310. The signal FzSwap indicates if a fuse address is to be switched (e.g., if the addresses stored in latches $CA_1$ and $CA_2$ should be swapped). The signals FzCp indicates an address which identifies the CP 310, and the signal FzCa indicates an address which indicates a CS address within that CP. In some embodiments, there may be more sets of signals 303 than there are CPs 310, which may allow multiple repairs/swaps to be performed per CP.

The GCR logic 300 includes compare logic 304. If the fuse signal FzSwap is at an active level (e.g., a high logic level), the column address CA matches an address stored in the local latches 302 (e.g., CA[9:5] matches fzCA[9:5]), then the compare logic 304 provides a swap enable signal SwapEn at an active level. The compare logic 304 may also pass the CP address FzCp to a set of local comparators 308. There is a local comparator associated with each of the CPs 310. The local comparators 308 each provide a signal Swap at an active level, only if the address FzCp matches the address of the CP 310 associated with that local comparator 308. Accordingly, there may be a number of signals Swap, each associated with a CP 310, and only the signal Swap associated with the CP 310 which matches the address FzCp will be active. A set of swap logic circuits 306 each associated with one CP 310, each provide column addresses CA' to the local latches 314. If the signals SwapEn and Swap are both active, then the swap logic 306 may alter the addresses CA' provided to the local latches 314 to swap the addresses of two CS sets in that CP. The signal FzCa may indicate which addresses should be altered.

For example, the swap logic 306 may invert a value of a most significant bit of CA to generate the altered address CA'. For example, if the portion of the CA value is the binary number 01 (e.g., 1) which is normally associated with $CS_A$, and it was to be stored in the local latch 314 for a given column plane 310 then the swap logic 306 may store the binary value 11 in the latch 314 for one of the column planes 310, which may cause the signal $CS_B$ to be activated (instead of $CS_A$). Similarly, when the value 11 is received which is normally associated with $CS_B$, then the swapped value CA' may be 01 for that column plane which may cause the signal $CS_A$ to be activated (instead of $CS_B$). In this manner, during access operations (assuming the address has not been repaired), then when a column address CA is provided as part of an access operation, if the CA specifies a value of 01, then the bit lines associated with $CS_B$ will be accessed, while if the CA specifies a value of 11, then the bit lines associated with $CS_A$ will be accessed.

The compare logic 304 compares information from the fuse latches 302 to a column address CA to determine if the address CA indicates an address which has been repaired (e.g., reassigned to the GCR-CP 320). For example, when the user issues a column command such as read, write, read modify write, etc., then the column address CA may be loaded into all of the comparator circuits 304 at the same time such that comparison may be done in parallel. If the FzCa information transferred to compare logic 304 matches the column address CA, then the compare logic 304 provides a match signal Match at an active level and the associated CS set in the GCR-CP 320 may be accessed.

Figure 4:
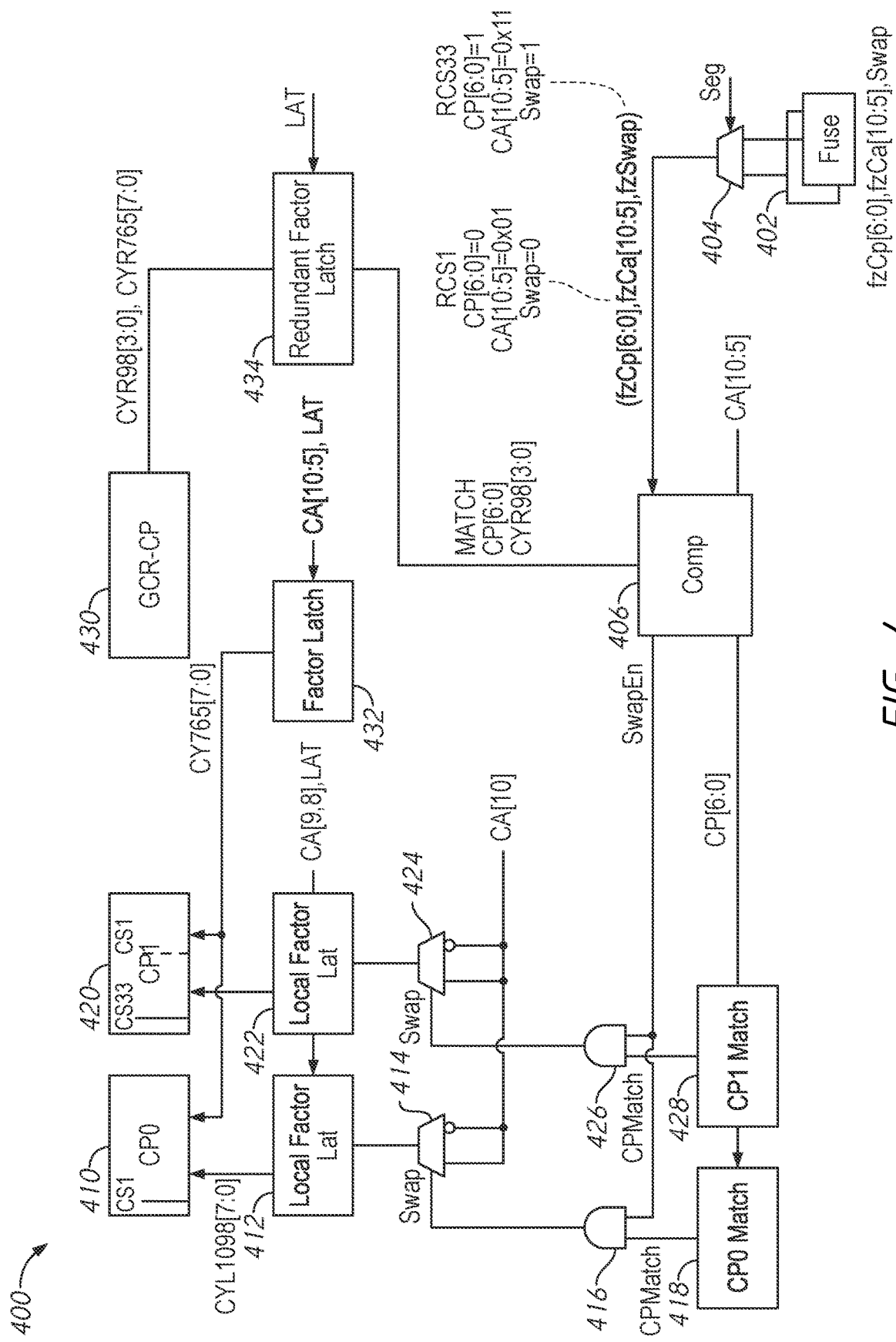
FIG. 4 is a block diagram of GCR logic according to some embodiments of the present disclosure.

FIG. 4 is a block diagram of GCR logic according to some embodiments of the present disclosure. The GCR logic 400, may, in some embodiments, be included in the memory device 100 of FIG. 1, be an implementation of the GCR logic 300 of FIG. 3, and/or be used to perform the operations described with respect to FIG. 2.

The GRC logic 400 of FIG. 4 shows an example implementation where, for the sake of explanation, certain lengths of signals (e.g., number of bits) and assignments of meanings to the ordering of those bits are presented. For example, a column plane address CP is described as a 7 bit value (e.g., CP[6:0]) and a portion of the column address CA is described as a 6 bit value (e.g., CA[10:5]). For brevity, the six bits of the column address CA[10:5] may generally be referred to as a column address with respect to FIG. 4, however those bits may represent a portion of a longer column address provided to an address decoder. It should be understood that the number and arrangement of bits described in FIG. 4 are merely one example implementation, and that different numbers of bits, or assignments of meaning to those bits may be used in other example embodiments.

The GCR logic 400 includes two example 'normal' column planes CP0 410 and CP1 420, and a GCR-CP 430. A factor latch 432 receives the row address CA[10:5] responsive to a latch signal LAT, which may be a timing signal as part of an access operation. The factor latch 432 provides a decoded address signal CY765 [7:0] in common to the column planes CP0 410, CP1 420. In addition, the three column planes also have local latches which provide a local decoded address signal specific to that column plane. The first column plane CP0 410 has a first set of local latches 412, which store and decode addresses used to access the CS in CP0 410. The second column plane 420 has a second set of local latches, and the GCR-CP 430 has redundant latches 434. The local latches 412 and 422 receive a portion of a column address CA[9,8] and a bit CA[10] which may be inverted based on swap logic as described herein, and provide respective decoded signals CYL1098 [7:0]. Based on the decoded signals CY765 received in common and the respective local signal CYL1098, each column plane may activate a column select signal. In an analogous fashion, the redundant latch 434 provides decoded signals CYR98 and CYR765 which activate a column select signal in the GCR-CP 430 when the comparator 406 indicates that the column address has been repaired.

A multiplexer 414 and AND gate 416 act as swap logic (e.g., 306 of FIG. 3) to selectively alter the address(es) saved in the local latch 412 as described in more detail herein. A local comparator 418 activates the swap logic when a CP address indicates the CP0 410 associated with the local comparator 418. and a local comparator 428 activates the swap logic when a CP address indicates CP1 420.

For the sake of brevity, only one CP and it's set of associated circuits and signals will be described in detail. However, such description may apply to either CP and their associated circuits.

The GCR logic 400 also includes a GCR-CP 430. The GCR-CP 430 may be generally similar to the CPs 410 and 420, except that GCR-CP 430 includes redundant CS used as part of repair operations. A comparator 406 receives signals from fuse latches 402 and the column address CA and provides a MATCH signal along with column plane address CP and decoded redundant address CYR98 and CYR765 if the current column address matches a repaired address from the fuse latches 402. The redundant latch 434 stores and decodes the column address bits responsive to MATCH and provides decoded signals CYR98 and CYR765 to activate a column select signal in the GCR-CP. A signal (not shown) going to each CP 410 and 420 from the redundant latch 434 may prevent the corresponding set of bit lines in the CP 410 or 420 from being accessed if that address has been repaired (e.g., if MATCH is active).

As part of an access operation, the memory may provide a column address CA along with a signal LAT. The signal LAT may be a pulse signal, such as a CS pulse, which is used to control a timing of access operations. Responsive to LAT, the information in the latches 412, 422, 432, and 434 may be updated based on the current column address, and the decoded signals provided by those latches may also update. Responsive to the updated decoded address signals, column select signals in one or more column planes may be activated. Information stored in a redundant fuse latches 402 may be used to selectively change or direct the addresses loaded in the latches 412, 422, 432, and 434. In this way, column addresses may be repaired and/or swapped within a column plane and then repaired.

The redundant fuse latches 402 (e.g., 119 of FIGS. 1 and/or 302 of FIG. 3) includes a number of sets of information, encoded by the state of fuses within the array. In the example of FIG. 4, the fuse array has sets of information organized by column plane. A multiplexer 404 may determine which set of information to provide based on a segment signal Seg.

The multiplexer 404 provides a set of information related to the current row activation location (e.g., segment). A set of information may include a column plane address fzCp, which may be a 7 bit signal (e.g., fzCp[6:0]), a column address fzCa, which may be a 6 bit signal (fzCa[10:5]), and a swap signal fzSwap, which may be a one bit signal. There may also be an enable signal which indicates whether the redundancy should be enabled. There may be a set of signals for each CS for example, a signal fzCp, fzCa, and fzSwap for each CS. For example, there may be 32 sets of fzCp, fzCa, and fzSwap for each CP.

A comparator 406 receives the signals fzCp, fzCa, and fzSwap from the fuse latches 402 (through multiplexer 404). The comparator 406 also receives a column address CA as part of an access operation. The comparator provides a signal SwapEn at an active level when the signal fzCa matches the column address CA and when the signal fzSwap is active (e.g., at a high level). The comparator 406 may compare the bits of fzCa and CA. In some embodiments, the comparator 406 may skip comparing the bits used to swap the addresses. For example in the example a FIG. 4, a most significant bit is used to swap addresses and the bits of fzCa and CA may be compared except for a most significant bit. Other bits may not be compared in other embodiments where different logic is used to swap addresses within a column plane. In this example, the bits CA[9:5] and fzCa [9:5] are compared, but the bits CA[10] and fzCa[10] are ignored. If the signal SwapEn is provided at an active level, then a column plane address CP is also provided by the comparator 406. The column plane address CP[6:0] may be the fuse CP address fzCp[6:0] from one of the redundancy sets with SwapEn at an active level.

The signal SwapEn is provided in common to each of the swap logic circuits. For example, one terminal of each of the AND gates 416 and 426 is coupled to the signal SwapEn from the comparator 406. Each of the local comparators 418 and 428 receives the CP address from the comparator. Each local comparator provides a respective CPMatch signal only when the CP address matches a value programmed in that local comparator. For example, the local comparator 418 provides a signal CPMatch at an active level only when the CP address has a value which matches a value associated with CP0 410 (e.g., when CP=000000), while the local comparator 428 provides a signal CPMatch at an active level when the CP address has a value associated with CP1 420 (e.g., when CP=000001).

Each AND gate 416 and 426 provides a respective swap signal Swap at an active level when the signal SwapEn is active and when the signal SwapEn from the respective local comparator 418 and 428. In other words each CP 410 and 420 has an associated signal Swap which is only active when an address CA matches an address fzCa stored in the fuse latches (except for the most significant bit), when a signal fzSwap is active, and when an address fzCp matches an address of that column plane. The signal Swap is coupled to a selector terminal of a multiplexer (e.g., 414 and 424).

Each CP 410 and 420 has an associated multiplexer 414 and 424 which receives the column address CA. In the embodiment of FIG. 4, the multiplexer only receives a most significant bit CA[10]. Each multiplexer has an inverting input and non inverting input coupled to CA[10]. If the signal Swap is inactive, then the non-inverted value of CA[10] is provided as the output of the multiplexer 414 and 424 to the local latch 412 or 422. If the signal Swap is active, then the inverted value of CA[10] is provided. The local latches 412 and 422 store the column address CA, with the most significant bit, CA[10] provided by the multiplexer 414 or 424 associated with that latch. Accordingly, if the signal Swap is active, then the address is stored with an inverted value of its most significant bit. Since the comparator 406 provides the signal SwapEn without comparing the most significant bit of CA, then two addresses (e.g., the ones which share everything but their most significant bit in common) may both have their most significant bit inverted.

In this way, the portion of the column addresses loaded into two local latches 412 and 422 may be swapped. For example, if the bits of the column address CA[10:8] were 000, and the Swap signal is active for CP1 420, then the value 000 is loaded into local latch 412, but the value 100 is loaded into local latch 420. Accordingly, the decoded signals CYL1098 for CP0 410 and CP1 420 are different, and different column select signals CS are activated in CP0 410 and CP1 420. For example, if the column address CA[10:5] would normally lead to a signal CS1 being activated in the column planes, but the signal Swap is active for CP1 420, then the signal CS1 may be active in the CP0 410, but the signal CS33 may be active in the CP1 420. Accordingly, different bit lines would become active in CP0 and CP1, unless, as described herein, the addresses are repaired, in which case bit lines in the GCR-CP 430 will be activated.

The comparator 406 also provides a signal MATCH based on a comparison of the address CA to the address fzCA from the fuse latches 402. If there is match between CA and fzCa, then the signal MATCH is provided at an active level along with the CP address CP (which is fzCp) and a decoded address signal CYR98 and CYR765. The decoded address signal CYR98 and CYR765 may be based on which column redundancy set provides the signal MATCH. The number of these signals may be based on a number of the redundant CS lines. The latch 434 stores the address CA and the column plane address CP responsive to the signal MATCH being active (and a pulse of the latch signal LAT).

For example, a first set of information from the fuse latches includes a column plane address which specifies CP0 410 (e.g., CP[6:0]=0), a column address CA which specifies a column select set CS1 (e.g., CA[10:5]=0x01), and an inactive fuse swap signal fzSwap=0. Since the signal fzSwap is inactive, the comparator 406 will only provide SwapEn at an inactive level. Accordingly, the address 0x01 is latched in the local latch 412 associated with the first CS set CS1. When the address CA matches the address 0x01, the signal MATCH is provided at an active level, and the address CA=0x01 and CP=0 are both latched in the latches 434. Accordingly during an access operation, when the column address calls for 0x01 and CP0, a redundant set of bit lines RCS1 in the GCR-CP 430 will be accessed instead of CS1 in CP0 410.

A second example set of information includes a column plane address which indicates CP1 420 (e.g., CP=1), a column address CA=0x11 associated with a second CS set CS33, and an active fzSwap signal. Accordingly, the comparator 406 provides SwapEn at an active level when the address CA matches 0x*1 (where * indicates that the MSB is not compared). In other words SwapEn will be active for both CA=0x11 and CA=0x01. Since CP=1, only the local comparator 428 will provide CPMatch at an active level, and thus the addresses 0x0 and 0x11 will have their most significant bit inverted when they are stored in the local latches 422. Accordingly, the address 0x11 will be associated with a first CS set and the address 0x01 will be associated with a second CS set. For example, normally the signal CYL1098 [0] is high when CS1 is accessed by 0x01, instead CYL1098 [4] will be high responsive to 0x01 and CYL1098 [0] will be high responsive to 0x11. In addition, when the address CA matches fzCa, the signal MATCH will be provided at an active level. Accordingly, CS33 in CP1 420 will be repaired by programming the failed addresses in the redundant column set.

Figure 5:
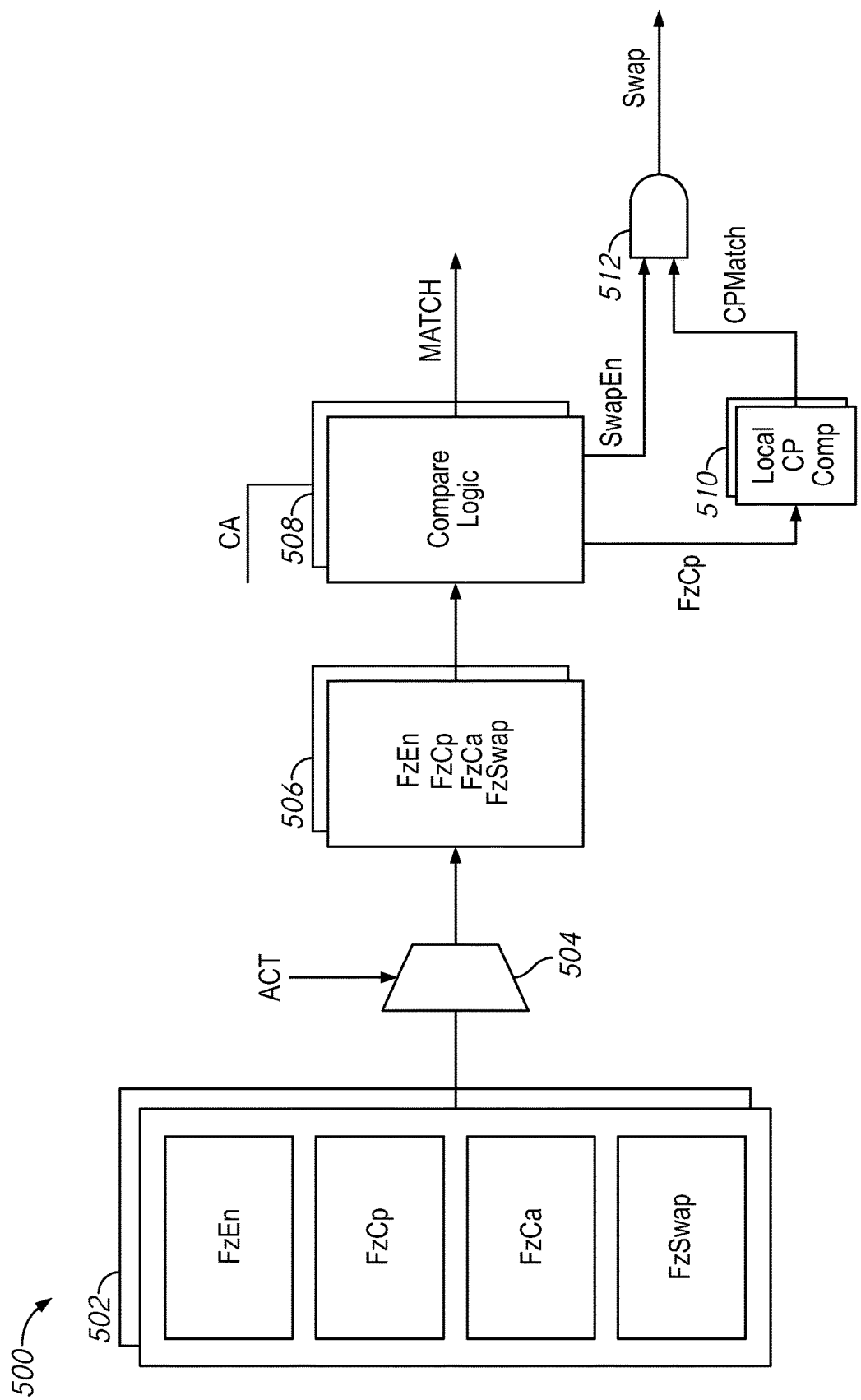
FIG. 5 is a block diagram of GCR logic according to some embodiments of the present disclosure.

FIG. 5 is a block diagram of GCR logic according to some embodiments of the present disclosure. The GCR logic 500 may represent a portion of the GCR logic focused on generating the Swap and MATCH signals used to swap the addresses within a selected column plane and repair an address respectively. For example, the GCR logic 500, may, in some embodiments, be included in the memory device 100 of FIG. 1, be an implementation of the GCR logic 300 of FIGS. 3 and/or 400 of FIG. 4, and/or be used to perform the operations described with respect to FIG. 2.

The GCR logic 500 includes a fuse latches 502 which stores a number of sets of information. The sets include a number of individual values, which are programmed into the fuse array 502. For example, the information may be programmed into the fuse array 502 by a repair analyzer (e.g., 150 of FIG. 1) based on testing and locating errors in memory array (not shown in FIG. 5). For example, a given set of information may relate to a repair operation such as a GCR operation. The set includes a fuse enable signal FzEn which indicates if the set of information is active or not, a fuse column plane address FzCp which indicates a column plane, a fuse column address fzCa which indicates a column select set (e.g., a value of CS signal) in a column plane, and a fuse swap signal FzSwap which indicates if the address should be swapped within a column plane.

A multiplexer 504 provides the sets of information 506 with timing based on an activation signal ACT (which may act as the segment signal Seg of FIG. 4). There may be a number of sets 506 based on a number of CS sets in a column plane. For example, there may be 32 sets 506.

Compare logic (e.g., 304 of FIGS. 3 and/or 406 of FIG. 4) receives the set of information 506. The compare logic provides a match signal MATCH at a high level if a received column address CA matches the FzCA address in the set 506. If the signal MATCH is active, the address CA (or a portion thereof) may be repaired (e.g., by storing in a latch 322 of FIGS. 3 and/or 432 of FIG. 4). If there is match between a portion of the address FzCa and a corresponding portion of the address CA, then the signal SwapEn may be provided at an active level. For example, every bit except the most significant bits of CA and FzCa may be compared. If the signal SwapEn is provided at an active level, then the fuse column plane address FzCp is also provided to a local comparator 510.

The local comparators 510 (e.g., 308 of FIGS. 3 and/or 418/428 of FIG. 4) are each programmed with a code which identifies a column plane. If the received fzCp matches that code, then that local comparator 510 provides a respective CPMatch signal at an active level. An AND gate 512 provides swap signal Swap at an active level if both SwapEn and CPMatch are active. There may be a number of local comparators 510, and thus a number of CPMatch signals and AND gates 512 based on the number of column planes. For example, there may be 33 local comparators 510, column plane match signals CPMatch, and swap signals Swap.

When the swap signal is active, two logical addresses are exchanged within the current column plane as indicated by FzCp. For example, the two logical addresses may have their most significant bits exchanged.

Figure 6:
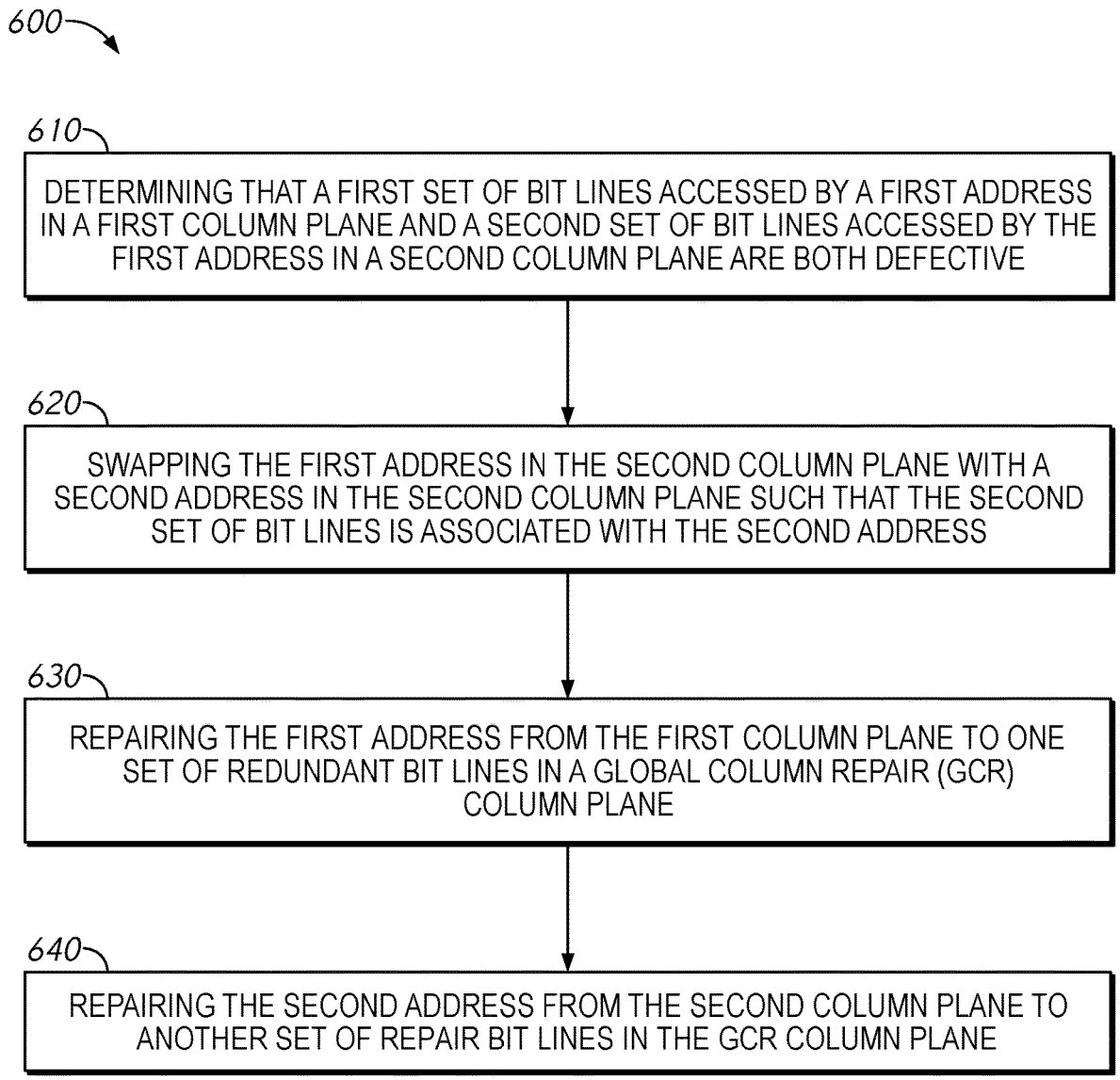
FIG. 6 is a flow chart of a method according to some embodiments of the present disclosure.

FIG. 6 is a flow chart of a method according to some embodiments of the present disclosure. The method 600 may, in some embodiments, be implemented by one or more of the apparatuses or systems of FIGS. 1 and 3-5 and may be used to perform the swapping and repair described with respect to FIG. 2.

The method 600 may generally begin with box 610, which describes determining that a first set of bit lines accessed by a first address in a first column plane (e.g., set 212 in CP 210 of FIG. 2) and a second set of bit lines accessed by the first address in a second column plane (e.g., set 222 in CP 220 of FIG. 2) are both defective. For example, the method 600 may include testing a memory with a repair analyzer (e.g., 150 of FIG. 1) to locate addresses associated with defective bit lines or sets of bit lines. If it is determined that the first address is defective in both the first and the second column planes, then the method may include programming information into a fuse array (e.g., 125 of FIG. 1). For example the method 600 may include programming a first set of information which includes the first address, a first column plane address associated with the first column plane, and a swap signal at an inactive level (e.g., FzSwap), and programming a second set of information which includes the second address, a second column plane address associated with the second column plane and a swap signal at an active level. The information in the fuse array may be stored in fuse latches for use during operation of the memory.

The method 600 includes box 620 which describes swapping the first address in the second column plane with a second address in the second column plane such that the second set of bit lines is associated with the second address. For example the method may include converting the first address to the second address by inverting a most significant bit of the first address (e.g., with swap logic such as 306 of FIG. 3). The method 600 may include generating a swap enable signal based on when a received column address matches the first or the second address (e.g., because the most significant bit is ignored in the comparison) from the fuse latches, and the swap signal from the fuse latches is active. The method may include comparing the column plane address from the fuse array to a value stored in each of a number of local comparators (e.g., 308 of FIG. 3) and then generating a swap signal when the swap enable signal is active and there is match. Responsive to the swap signal being active, the addresses may be swapped. The addresses may be swapped by assigning the second address to the second set of bit lines by changing the address stored in local latches associated with that column plane. The method 600 may also include assigning the first address to a third set of bit lines in the second column plane.

The method 600 includes box 630 which describes repairing the first address from the first column plane to a first set of redundant bit lines in a global column repair (GCR) column plane and box 640 which describes repairing the second address from the second column plane to a second set of repair bit lines in the GCR column plane. The addresses may be repaired by storing the first address in a first repair local latch and the second address in a second repair local latch (e.g., 322 of FIG. 3). The method 600 may include providing a match signal at an active level responsive to a fuse column address stored in a fuse array matching the received column address and repairing the column address responsive to the match signal being active. The method 600 may include receiving the first address as part of an access operation and accessing the first set of redundant bit lines and receiving the second address as part of an access operation and accessing the second set of redundant bit lines.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a first column plane comprising a first set of bit lines accessed when a column address is decoded into a first column select signal and a second set of bit lines accessed when the column address is decoded into a second column select signal;
a global column repair (GCR) comprising a first set of redundant bit lines accessed when the column address matches a value stored in a first repair latch and a second set of repair bit lines accessed when the column address matches a value stored in a second repair latch;
swap logic configured to receive a first address value associated with the first column select signal, a second address value associated with the second column select signal and access the second set of bit lines responsive to the first address value and the first set of bit lines responsive to the second address value when a swap signal being active;
compare logic configured to store the second address value in the second repair latch and configured to provide a swap enable signal at an active level; and
a local comparator associated with the first column plane, wherein the local comparator is configured to receive a column plane address from the compare logic and provide the swap signal at the active level when the column plane address matches a value programmed in the local comparator and the swap enable signal is active.

2. The apparatus of claim 1, further comprising:
a second column plane comprising a third set of bit lines accessed when the column address is decoded into a first column select signal, and
wherein the compare logic is further configured to store the first address in the first repair latch.

3. The apparatus of claim 1, further comprising a fuse array configured to store a fuse column plane address, fuse column address, and a fuse swap signal, and further comprising a comparator configured to receive a column address and store the second address in the second repair latch when the column address matches the fuse column address, and provide the swap enable signal at an active level and provide the fuse column plane address as the column plane address when the column address matches the fuse column address.

4. The apparatus of claim 1, wherein the swap logic is configured to change the first address value into the second address value and the second address value into the first address value responsive to the swap signal being active.

5. The apparatus of claim 4, wherein the swap logic is configured to invert a bit of a received address value when the swap signal is active.

6. The apparatus of claim 1, wherein when the column address has the second value, the second set of repair bit lines but not the first set of bit lines are accessed.

7. A method comprising:
determining that a first set of bit lines accessed by a first address in a first column plane and a second set of bit lines accessed by the first address in a second column plane are both defective;
swapping the first address in the second column plane with a second address in the second column plane such that the second set of bit lines is associated with the second address;
repairing the first address from the first column plane to one set of redundant bit lines in a global column repair (GCR) column plane;
repairing the second address from the second column plane to another set of repair bit lines in the GCR column plane
storing a fuse column address, fuse column plane address, and fuse swap signal in a fuse array;
comparing a portion of the fuse column address to a portion of a received column address with a comparator circuit and providing the fuse column plane address and a swap enable signal at an active level when the fuse address matches the fuse column address and the fuse swap signal is active;
comparing the fuse column plane address to a value programmed in a local comparator associated with the second column plane and providing a swap signal at an active level when the swap enable signal is active and the fuse column plane address matches the value; and
swapping the first address and the second address when the swap signal is at the active level.

8. The method of claim 7, further comprising swapping the first address and the second address in the second column plane by inverting a bit of the first address and a bit of the second address.

9. The method of claim 7, further comprising:
providing a match signal at an active level with the comparator circuit responsive to the fuse column address matching the received column address; and
repairing the column address responsive to the match signal being active.

10. The method of claim 7, further comprising:
receiving the first address as part of an access operation and accessing the first set of redundant bit lines; and
receiving the second address as part of an access operation and accessing the second set of redundant bit lines.

11. An apparatus comprising:
a first column plane comprising a first set of bit lines associated with a first address, wherein the first column plane is associated with a first column plane address;
a second column plane comprising a second set of bit lines associated with the first address, wherein the second column plane is associated with a first column plane address;
swap logic configured to change the first address to a second address different than the first address and assign the second address to the second set of bit lines;
compare logic configured to repair the first address and the second address by assigning them to a respective first set of redundant bit lines and a second set of redundant bit lines and further configured to provide a swap enable signal at an active level and the second column plane address; and
a local comparator configured to provide a swap signal at the active level when the swap enable signal is active and the second column plane address matches a value programmed in the local comparator,
wherein the swap logic is configured to change the received column address for the second column plane when the swap signal is active.

12. The apparatus of claim 11, wherein the swap logic is configured to change the first address to the second address by inverting a bit of the first address.

13. The apparatus of claim 11, wherein the swap logic is further configured to assign the first address to a third set of bit lines in the second column plane.

14. The apparatus of claim 11, further comprising:
a first local latch associated with the first column plane;
a second local latch associated with the second column plane;

wherein the swap logic is configured to receive the first address and store a portion of the first address in the first local latch and store a changed portion of the first address in the second local latch.

15. The apparatus of claim 11, further comprising a fuse array configured to store a first set of information including the first address, the first column plane address associated with the first column plane and a fuse swap signal at an inactive level, and a second set of information including the second address, the second column plane address associated with the second column plane and the fuse swap signal at an active level.

16. The apparatus of claim 15, wherein the compare logic is further configured to provide the second column plane address when the received column address matches the first address or the second address and the fuse swap signal is at the active level.

17. The apparatus of claim 15, wherein the compare logic is configured to repair the first address responsive to a received column address matching the first address in the first set of information and configured to repair the second address responsive to the received column address matching the second address in the second set of information.

\* \* \* \* \*

UNITED STATES PATENT AND TRADEMARK OFFICE
CERTIFICATE OF CORRECTION

| | | Page 1 of 1 |
|---|---|---|
| PATENT NO. | : 12,354,694 B2 | |
| APPLICATION NO. | : 17/654275 | |
| DATED | : July 8, 2025 | |
| INVENTOR(S) | : Yoshinori Fujiwara et al. | |

It is certified that error appears in the above-identified patent and that said Letters Patent is hereby corrected as shown below:

On the Title Page

|  | Reads | Should Read |
|---|---|---|
| Item [73], | "Micron echnology, Inc." | --Micron Technology, Inc.-- |

Signed and Sealed this
Twenty-eighth Day of October, 2025

John A. Squires
*Director of the United States Patent and Trademark Office*